United States Patent [19]

Ingle et al.

[11] Patent Number: 5,192,015

[45] Date of Patent: Mar. 9, 1993

[54] METHOD FOR WIRE BONDING

[75] Inventors: Lloyd D. Ingle, Lompoc; John D. Koontz, Santa Barbara, both of Calif.

[73] Assignee: Santa Barbara Research Center, Goleta, Calif.

[21] Appl. No.: 795,416

[22] Filed: Nov. 20, 1991

[51] Int. Cl.⁵ .................................... H01L 21/607
[52] U.S. Cl. ................................. 228/111; 228/110; 228/179
[58] Field of Search .............. 228/1.1, 102, 110, 111, 228/179

[56] References Cited

U.S. PATENT DOCUMENTS

| | | | |
|---|---|---|---|
| 3,610,506 | 10/1971 | Robinson | 228/111 |
| 3,822,465 | 7/1974 | Frankort et al. | 228/111 X |
| 4,496,095 | 1/1985 | Renshaw et al. | 228/102 |

Primary Examiner—Kenneth J. Ramsey
Attorney, Agent, or Firm—W. C. Schubert; W. K. Denson-Low

[57] ABSTRACT

A first piece (22) is bonded to a second piece (24) at a selected location (45) by positioning the first piece (22) and second piece (24) between a pair of bonding tools (36 and 38), with the bonding tools at the selected location (45) of the first piece (22) and the second piece (24) where bonding is to be achieved. The selected location (45) of the first piece (22) and the second piece (24) is pressed between the pair of bonding tools (36 and 38) with an applied force (46), the applied force (46) increasing from zero to a prebonding force (64), being maintained at the prebonding force (64) for a prebonding period (66), changing to a bonding force (60), and thereafter decreasing from the bonding force (60) to zero. Ultrasonic energy (48) is applied to the selected location (45) through at least one of the bonding tools (36 and 38), the ultrasonc energy (48) increasing to a prebonding energy (68) during the period that the applied force (46) is being increased from zero to the bonding force (60), being maintained at the prebonding energy (68) during at least a portion of the prebonding force period (66), changing to a bonding energy (72) prior to the time that the applied force (46) reaches the bonding force (60), and thereafter decreasing to zero.

8 Claims, 3 Drawing Sheets

METHOD FOR WIRE BONDING

BACKGROUND OF THE INVENTION

This invention relates to the joining of materials, and, more particularly, to the wire bonding of articles using applied force and ultrasonic energy.

Wire bonding is a technique for bonding small pieces of metal together. It is widely used in the manufacture of electronic circuits and various devices that require the joining of small metallic pieces under conditions that do not permit extensive heating of the pieces and the surrounding structure, such as would be experienced if joining were accomplished by soldering or brazing. For example, external connections to a semiconductor electronic microcircuit on a silicon chip may be made using fine wires bonded at one end to pads on the microcircuit and at the other end to traces or leads. The microcircuit cannot be substantially heated by the bonding operation, because the electronic structure of the microcircuit could be damaged by the elevated temperature.

In wire bonding, the two pieces to be joined are placed into contact. They may be supported from one side on a substrate, and the substrate rests on a tool, typically a flat plate. A second tool is placed into contact with the other side of the pieces, so that the two pieces to be joined are sandwiched between the two pieces of tooling. The second tool usually has a tip in the form of an inverted truncated cone with a small bonding tip only slightly larger than the desired area of the bonded region. A compressive bonding force is applied between the pieces of tooling, and at the same time the second tool is excited ultrasonically, typically at a frequency of 60-100 KHz (kilohertz). The ultrasonic energy passes through the pieces being joined.

The truncated conical shape of the second tool concentrates the ultrasonic energy in a small area, resulting in a high energy density in that bonding area. The combination of the applied compressive bonding force and the ultrasonic energy cause the two pieces to weld together in the bonding area, completing the required joint. This process, termed "wire bonding" even though the pieces are not necessarily wires, can be completed in 0.1-0.2 seconds or less, transfers little heat into other regions of the pieces being bonded, and is amenable to bonding large numbers of pieces at the same time in different regions. Thus, using commercial automated wire bonding equipment, all of the wire bonds to a typical microcircuit can be completed in a few seconds (depending on the number of bonds required) without damaging the active circuit elements.

Wire bonding is widely used in many situations, but it has drawbacks in other situations. One such problem area is that not all materials respond to the wire bonding operation in the same way. For example, if one or both of the pieces being joined is a "soft" material that tends to deform extensively even without the application of ultrasonic energy, it is found that the wire bond may not be strong. In another example, if the substrate upon which the metallic pieces are supported is soft, it may be difficult to accomplish the wire bonding. As an example, it is difficult to use conventional wire bonding procedures to reproducibly bond metal wires to materials supported on compliant substrates such as Kapton, Nylon, Delron, and Duroid.

Thus, there is a need for an improved procedure for wire bonding of materials, particularly where one or both pieces, or the supporting substrate, is soft and readily deformed. The present invention fulfills this need, and further provides related advantages.

SUMMARY OF THE INVENTION

The present invention provides an improved approach for wire bonding pieces together. It is of particular utility where one or both pieces is mechanically soft, but can be used in the wire bonding of conventional, harder materials as well. It is controllable through a variety of parameters so that it is readily adapted to a variety of materials. It is accomplished by apparatus that is similar in mechanical operation to a conventional wire bonding apparatus, so that the present approach can be readily incorporated into existing industrial processes that require wire bonding.

In accordance with the invention, a method for wire bonding a first article to a second article at a selected location includes the steps of furnishing a first article and a second article; placing the first article over the second article; and positioning the first article and second article between a pair of bonding tools, with the bonding tools at a selected location of the first article and second article where bonding is to be achieved. The bonding process includes pressing the selected location of the first article and second article between the pair of bonding tools with an applied force, the applied force increasing from zero to a prebonding force, maintaining the prebonding force for a prebonding force period of time, thereafter changing the applied force from the prebonding force to a bonding force, and thereafter decreasing the force from the bonding force to zero. The process further comprises applying ultrasonic energy to the selected location through at least one of the bonding tools, the ultrasonic energy increasing to a prebonding energy during the period that the force is being increased from zero to the bonding force, maintaining the prebonding energy for a prebonding energy period of time, thereafter changing the ultrasonic energy to a bonding energy prior to the time that the applied force is decreased from the bonding force to zero, and thereafter decreasing the ultrasonic energy to zero.

In prior approaches, different combinations of force and ultrasonic energy application have been utilized. In the conventional approach, the ultrasonic energy is applied only after the bonding force is reached. In the "soft touch" approach used in some industrial bonding procedures, a constant level of ultrasonic energy is applied, before the applied force reaches its bonding force level. However, only a single level of ultrasonic energy is applied, with no high energy level achieved prior to a reduction to the energy level maintained during the bonding process.

In the present approach, the initial (prebonding) ultrasonic energy is applied prior to the time at which the applied force reaches the bonding force. Preferably, the applied force is increased from zero to an intermediate prebonding force, and held there for a period of time. The ultrasonic energy is applied at the prebonding energy, and maintained at that level while the applied force is held at the prebonding force. The ultrasonic energy is then changed to the bonding energy, and the force is changed to the bonding force. The bonding energy and bonding force are maintained for a period sufficiently long to permit the bonding to occur.

The application of ultrasonic energy prior to the time that the force reaches the bonding force aids in cleaning the surfaces to be bonded by dislodging surface contaminants. The prebonding energy could not be applied after the maximum bonding force is reached, or the trasmission of energy into the second piece would be so great as to result in extensive heating and melting of too large a region. The high ultrasonic energy application achieves some initial softening and spreading of the piece in contact with the ultrasonically vibrating tooling, and reduces its penetration into the other piece being bonded. The approach is therefore particularly satisfactory for bonding where the second piece is so soft that over-penetration is otherwise a problem.

The present approach, particularly in its preferred embodiments, is very versatile and adjustable to a variety of conditions for a variety of applications and materials. The prebonding energy, bonding energy, prebonding force, bonding force, duration of prebonding, rate of change from one force or energy to another, and duration of bonding can all be adjusted as required for each particular application. Since the configuration of the tooling, including the tool which applies the ultrasonic energy, is substantially the same as for prior wire bonding techniques, the present approach may be widely applied in circumstances similar to those for which wire bonding has long been used. However, the present approach makes it possible to wire bond materials that could not be wire bonded previously. Other features and advantages of the invention will be apparent from the following more detailed description of the preferred embodiments, taken in conjunction with the accompanying drawings, which illustrate, by way of example, the principles of the invention.

DETAILED DESCRIPTION OF THE INVENTION

Figure 1:
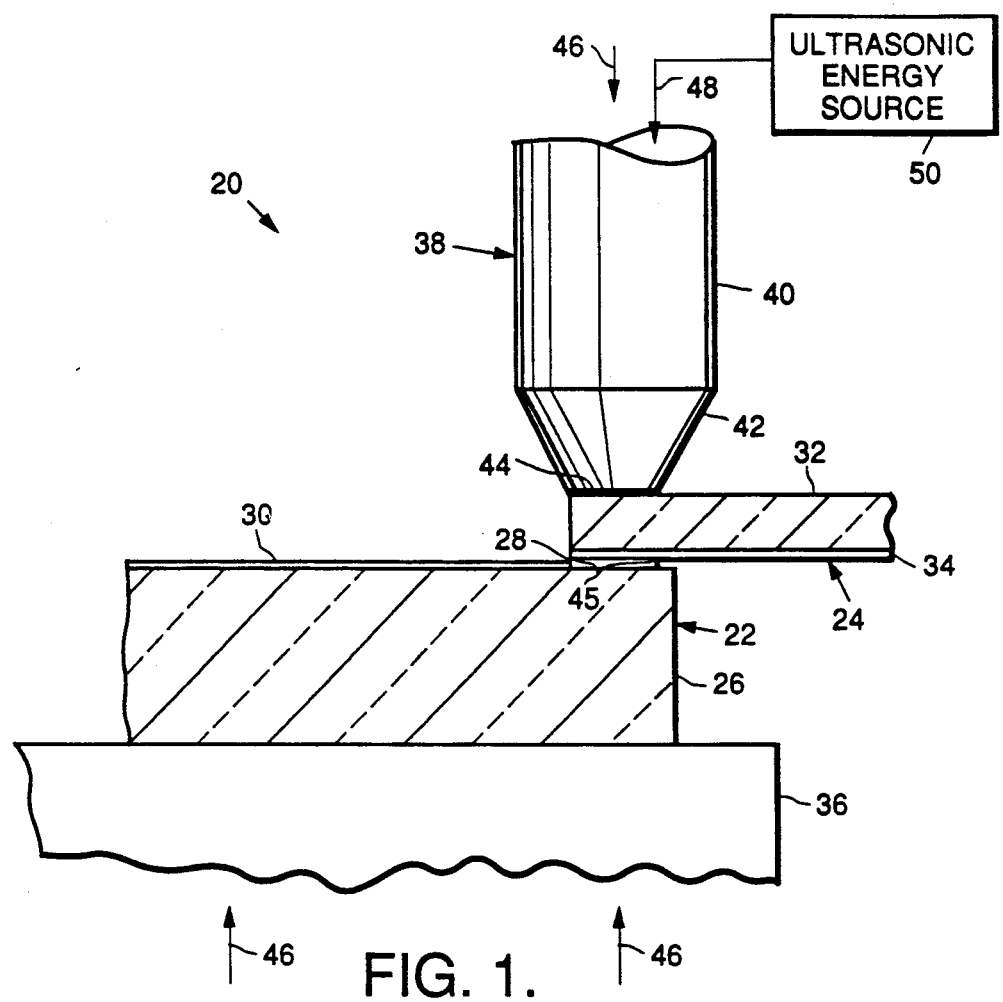
FIG. 1 is an elevational view of a wire bonding apparatus with pieces to be bonded.

FIG. 1 illustrates an apparatus 20 for wire bonding two pieces 22 and 24 together. In a typical situation, a first piece 22 is larger than the second piece 24. The first piece 22 is illustrated as including a substrate 26 with a bond pad 28 thereon and with a metallic trace 30 leading thereto. The second piece 24 is illustrated as having a substrate 32 with a metallic trace 34 thereon, although in many cases wire bonding is used to bond unsupported wires. These configurations for the pieces 22 and 24 being bonded are typical of the wire bonding situations encountered in practice, but the configurations of the pieces being bonded are not part of the present invention and the invention is not limited to the bonding of the illustrated configurations.

The apparatus 20 includes two dies 36 and 38 between which the pieces 22 and 24 are aligned so that the pieces 22 and 24 are in registry at a selected location to be bonded, in the illustrated case the bond pad 28 and the trace 34. A first die 36 is illustrated as a support block that serves as a base and to react applied forces, but has no other active function. A second die 38 is a tool having a body 40 ending in an inverted truncated cone portion 42 that contacts the second piece 24. The shape and area of a contact end 44 of the cone portion 42 are selected to be about the same size and shape as a bond region 45 of the pieces 22 and 24 to be bonded together. The contact end 44 is illustrated as flat, but it may be specially configured as necessary.

A compressive force, indicated schematically by arrows 46, is applied between the dies 36 and 38, and thence through the pieces being bonded 22 and 24 by any suitable apparatus that produces a compressive force. The apparatus normally separates the dies 36 and 38 to a distance sufficiently great to permit the pieces 22 and 24 to be placed between the dies, and then controllably closes the dies to the position illustrated in FIG. 1. The apparatus then provides for the force 46 to be applied in the loading pattern to be discussed subsequently.

The dies 36 and 38 also provide for ultrasonic energy, indicated schematically by an arrow 48, to be introduced into the pieces 22 and 24 from a source 50 through one (or both) of the dies 36 or 38, in the illustrated case the second die 38. The ultrasonic energy is concentrated into the bond region 45 of the pieces 22 and 24 by the truncated conical design of the cone portion 42, so that the ultrasonic energy density in the bond region 45 is quite high where the pieces 22 and 24 touch. When that high level of ultrasonic energy 48 is accompanied by a proper pattern of applied force 46, bonding of the pieces 22 and 24 to each other in the bond region 45 results.

When the first piece 22 is "soft", it is difficult to achieve good bonding of the second piece 24 to the first piece 22 in the bond region 45. As used herein, "soft" refers to a piece that tends to deform extensively even without the application of ultrasonic energy. The piece 22 could be soft for a variety of reasons, such as the substrate 26 being a deformable polymeric material or the pad 28 being a low melting temperature, readily deformable metal. When such deformation occurs, it is often not possible to attain sufficient cleaning of the surfaces to be bonded by the ultrasonic energy and subsequent uniform bonding in the bond region 45. The present invention has been found particularly useful in bonding pieces 22 and 24 when one or both pieces is soft and therefore difficult to bond by conventional wire bonding techniques.

Figure 2:
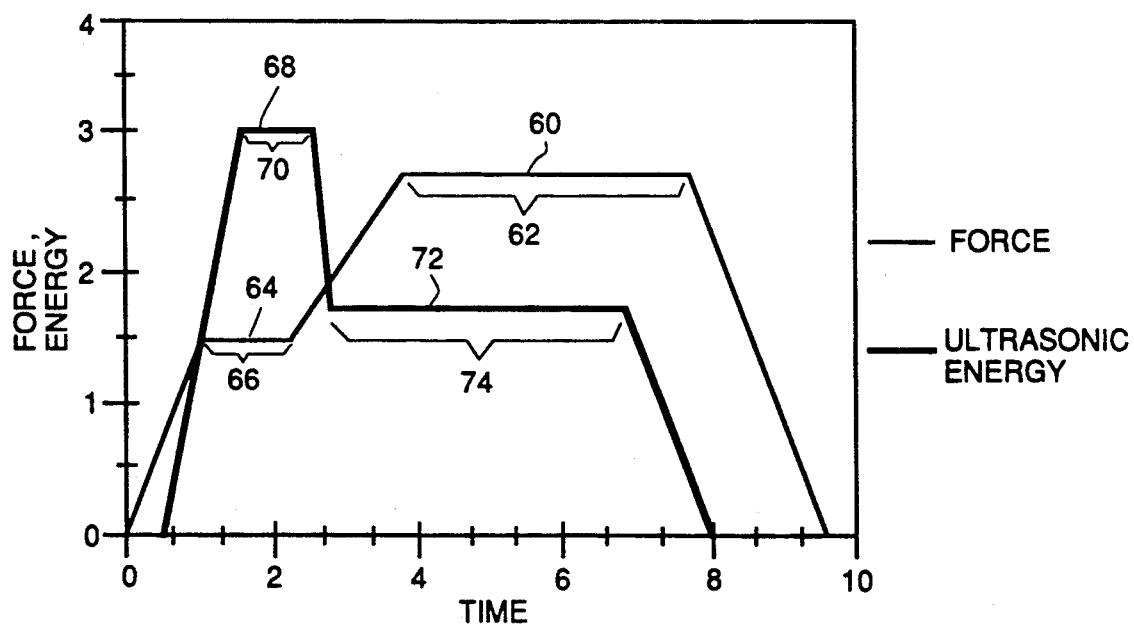
FIG. 2 is a graphical representation of the force and ultrasonic energy as a function of time for one preferred approach.

A key to attaining bonding of pieces using the present approach is the proper control of the magnitude and timing of the applied force 46 and the ultrasonic energy 48. The force and ultrasonic energy are applied by the apparatus 20 previously discussed. FIG. 2 is a graphical representation of one preferred sequencing of applied force and ultrasonic energy as a function of time. The applied force and applied energy are presented in relative units.

In the approach of FIG. 2, the applied force 46 is increased from zero to a bonding force 60. The applied force is desirably held at the bonding force 60 for a bonding force period 62. The applied force thereafter is decreased to zero. During the period in which the applied force increases, it may be held at a prebonding force 64 for a prebonding force period of time 66.

The ultrasonic energy 48 is applied during the period of force application, according to the following sequence. After the applied force 46 begins to increase from zero toward the bonding force 60, but before it reaches that bonding force 60, the ultrasonic energy 48 is increased from zero to a high prebonding energy 68, and desirably maintained at that prebonding energy 68 for a prebonding energy period of time 70. The prebonding energy 68 and prebonding energy period of time 70 are desirably at least in part coextensive with the prebonding force 64 and prebonding force period 66. The prebonding energy period of time 70 desirably ends prior to the time at which the applied force 46 reaches the bonding force 60.

The ultrasonic energy 48 is thereafter reduced from the prebonding energy 68 to a bonding energy 72, and desirably maintained for a bonding energy period of time 74. The bonding energy 72 and bonding energy period of time 74 are at least in part coextensive with the bonding force 60 and bonding force period of time 62. The ultrasonic energy 48 is thereafter reduced to zero, and the wire bonding operation is complete. The dies 36 and 38 are separated, and the bonded pieces 22 and 24 removed.

This combination of a lower prebonding force and higher bonding force, and a higher prebonding energy and lower bonding energy is of most interest in wire bonding to materials with soft substrates where the adhesion between the substrate and the bond pad metallization must be protected from dimpling of the substrate, and wherein the bond pad is known to be slightly contaminated.

Figure 3:
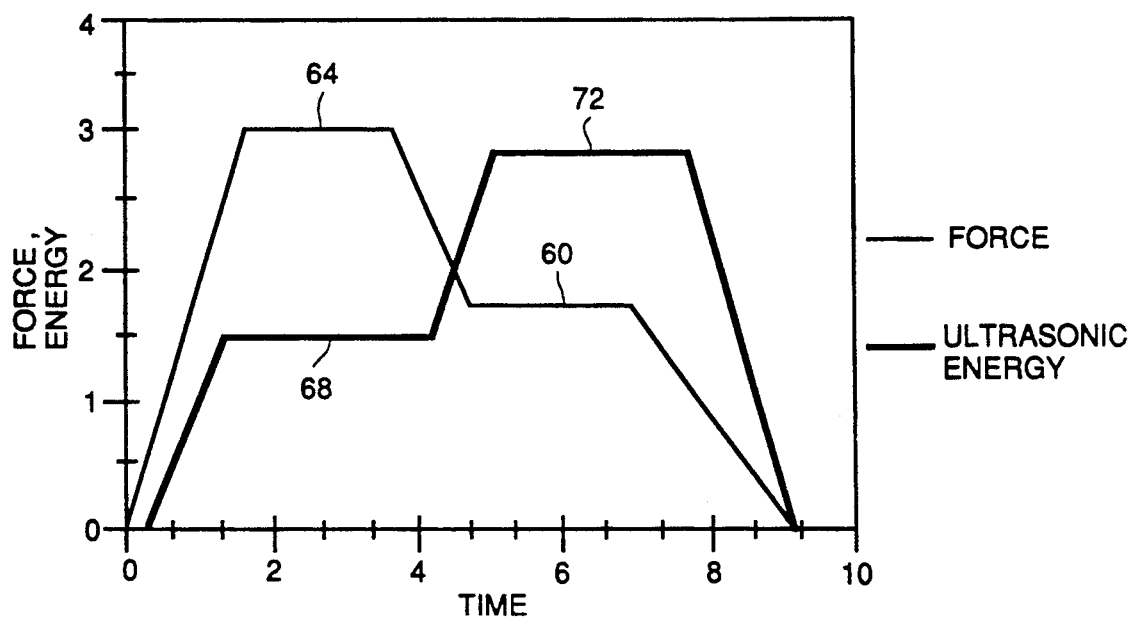
FIG. 3 is a graphical representation of the force and ultrasonic energy as a function of time for another preferred approach.

FIG. 3 is a graphical representation of another preferred sequencing of applied force and ultrasonic energy as a function of time. In this case, the prebonding force 64 is higher than the bonding force 60. The prebonding energy 68 is lower than the bonding energy 72. This combination of force and energy is of most interest in bonding to medium soft substrates where deformation will promote bond pad cleaning and increase the bonding area. The approach is also of interest where the adhesion of the bond pad to the underlying substrate is known to be small, as in the case of polysilicon, and the pad is slightly contaminate. This technique produces coupled contact with the bond pad and with a greater degree of bond wire deformation. It also promotes a slight scrub of the bond interface during deformation.

Figure 4:
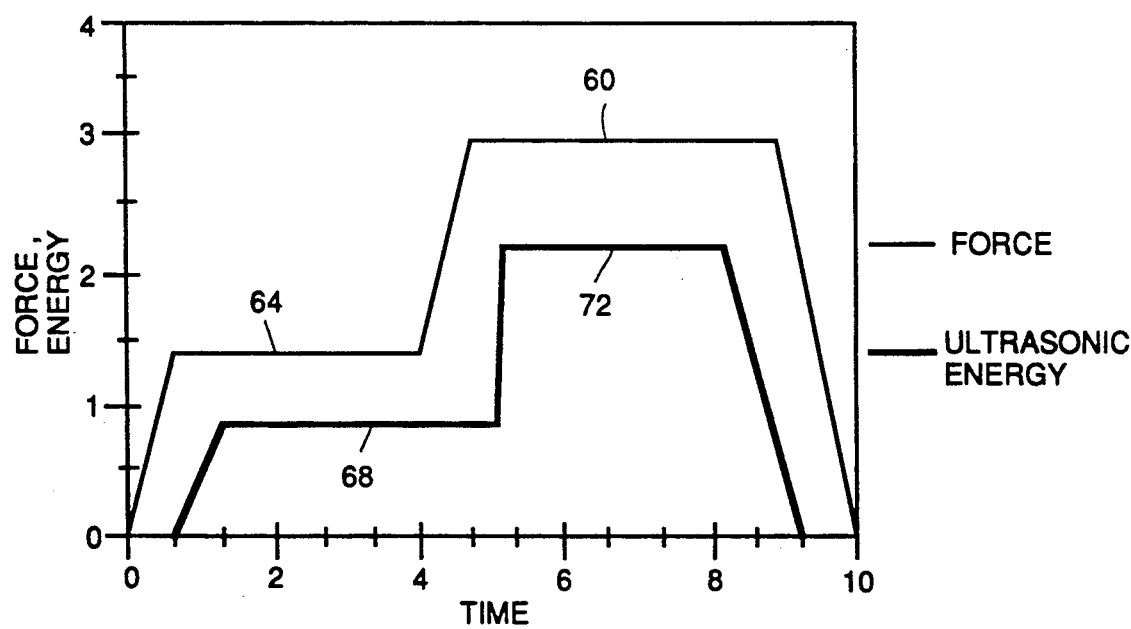
FIG. 4 is a graphical representation of the force and ultrasonic energy as a function of time for another preferred approach.

FIG. 4 is a graphical representation of another preferred sequencing of applied force and ultrasonic energy as a function of time. In this case, the prebonding force 64 is lower than the bonding force 60. The prebonding energy 68 is lower than the bonding energy 72. This combination of force and energy is a compromise between the approaches of FIGS. 2 and 3, and provides an intermediate level of deformation, scrubbing, and coupling.

The present approach is highly versatile, because it provides a number of adjustable control parameters that can be individually selected to best meet the requirements of a particular combination of pieces 22 and 24 to be bonded. The bonding force, bonding force period, prebonding force, prebonding force period, prebonding energy, prebonding energy period, bonding energy, and bonding energy period can all be adjusted and selected as required. Examples of the selection of these parameters will be provided subsequently.

The preferred ranges for the applied forces and energies are as follows: bonding force: about 15-150 grams, preferably about 50 grams; bonding period: about 10-400 milliseconds, preferably about 50 milliseconds; prebond force: about 15-150 grams, preferably about 25 grams; prebond period: about 10-400 milliseconds, preferably about 75 milliseconds; prebond energy: about 20 milliwatt-seconds to 2.5 watt-seconds, preferably about 70 milliwatt-seconds; and prebond energy: about 20 milliwatt-seconds to 2.5 watt-seconds, preferably about 1.2 watt-seconds.

Figure 5:
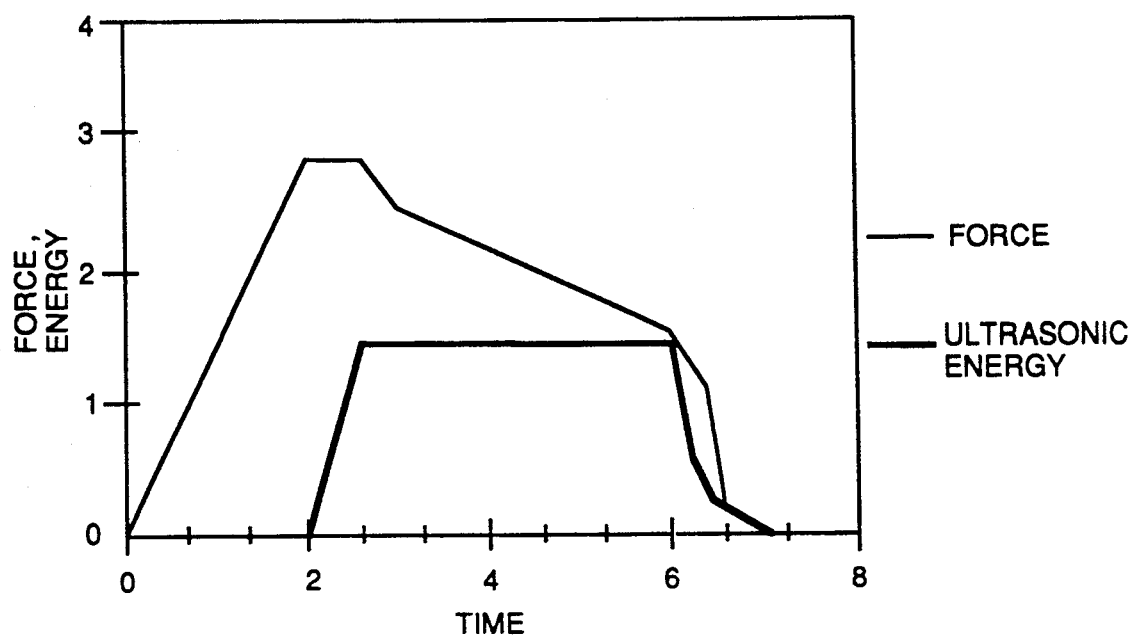
FIG. 5 is a graphical representation of force and ultrasonic energy as a function of time for a conventional wire bonding method.

The approach of the present invention is to be contrasted with other, known methods of applying force and ultrasonic energy in wire bonding. FIG. 5 is a graphical representation of the bonding profile in the conventional wire bonding approach. The force is increased to its maximum value before any ultrasonic energy is applied. There is nothing comparable to the applied prebonding energy 68 of the present invention.

Figure 6:
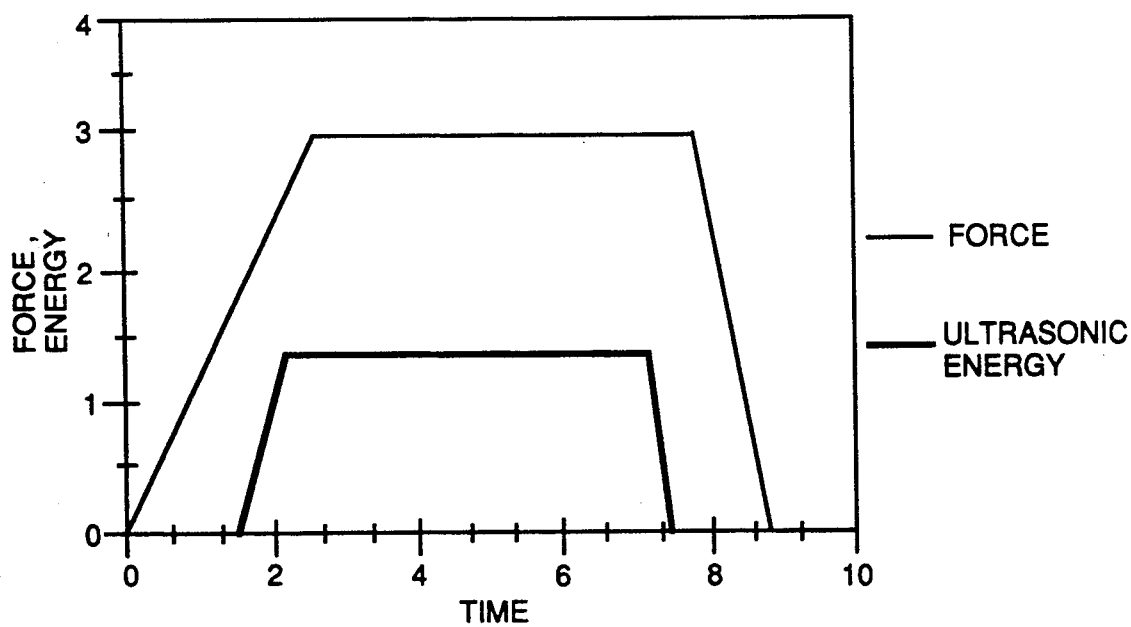
FIG. 6 is a graphical representation of force and ultrasonic energy as a function of time for a conventional "soft touch" wire bonding method.

FIG. 6 is a graphical representation of the "soft touch" approach for wire bonding. Here, the ultrasonic energy is applied prior to the point that the force reaches the bonding force, but at the same energy level as maintained during the bonding period. According to the present invention, at least one of the force and ultrasonic energy must be different during the prebonding period as compared with the bonding period. This difference promotes an ultrasonic scrub of the surface that improves the bonding quality.

As will be demonstrated in the following comparative examples, the present approach produces results superior to those of the conventional or approach.

The reason for the improved performance of the present invention is not known with certainty, and applicant does not wish to be bound by the following possible explanation. It is believed that the application of a high prebonding ultrasonic energy, prior to the time that the applied force reaches the bonding force, tends to scrub the interface between the pieces 22 and 24 in the bonding region 45, dislodging foreign matter and oxides that would otherwise tend to interfere with bonding. The prebonding energy also softens the pieces 22 and 24 in the bonding region 45 prior to application of the bonding force, and reduces the degree of penetration of the second die 38 into the pieces 22 and 24, and of the second piece 24 into the first piece 22 during the actual bonding operation. This latter effect is believed to be responsible for the improved bonding of soft pieces 22 and 24 experienced with the present invention.

The following example is intended to illustrate aspects of the invention, and should not be interpreted as limiting the invention in any respect.

An extensive study was performed of the bonding of a metallic wire to a metallic bonding pad supported on a hard or soft substrate, the configuration illustrated in FIG. 1. After bonding, the force required to pull the wire free of the bonding pad was measured. The total number of tests has exceeded 50,000, providing a good statistical basis for the results. The following table summarizes the results:

| Series | Bonding Profile | Substrate Material | Average Pull (g) | Standard Dev. (g) |
|---|---|---|---|---|
| 1 | FIG. 5 | Hard | 11.5 | 0.7 |
| 2 | FIG. 5 | Soft | 6.0 | 2.5 |

| Series | Bonding Profile | Substrate Material | Average Pull (g) | Standard Dev. (g) |
|---|---|---|---|---|
| 3 | FIG. 2 | Soft | 13.0 | 0.7 |

A comparison of the series 1 and series 2 test results show that the conventional bonding profile of FIG. 5, while operable for a hard substrate, is unsatisfactory for a soft substrate. A comparison of the series 2 and 3 test results demonstrates that the bonding profile of one of the preferred approaches of the invention, that of FIG. 2, produces an improvement in both the average bond strength and the standard deviation in bond strengths.

Although a particular embodiment of the invention has been described in detail for purposes of illustration, various modifications may be made without departing from the spirit and scope of the invention. Accordingly, the invention is not to be limited except as by the appended claims.

What is claimed is:

1. A method for bonding a first article to a second article at a selected location, using a wire bonding technique in which a bonding force and ultrasonic energy are applied at the location simultaneously, the method comprising the steps of:

furnishing a first article and a second article, at least one of the first article and the second article being sufficiently soft that it deforms when the bonding force is applied independently of applied ultrasonic energy;

placing the first article over the second article;

positioning the first article and second article between a pair of bonding tools, with the bonding tools at a selected location of the first article and second article where bonding is to be achieved;

pressing the selected location of the first article and second article between the pair of bonding tools with an applied force, the applied force increasing from zero to a prebonding force, maintaining the prebonding force for a prebonding force period of time, thereafter changing the applied force from the prebonding force to a bonding force, and thereafter decreasing the force from the bonding force to zero; and applying ultrasonic energy to the selected location through at least one of the bonding tools, the ultrasonic energy increasing to a prebonding energy during the period that the force is being increased from zero to the bonding force, maintaining the prebonding energy for a prebonding energy period of time, thereafter changing the ultrasonic energy to a bonding energy prior to the time that the applied force is decreased from the bonding force to zero, and thereafter decreasing the ultrasonic energy to zero.

2. The method of claim 1, wherein the prebonding force is less than the bonding force, and the prebonding energy is greater than the bonding energy.

3. The method of claim 1, wherein the prebonding force is greater than the bonding force, and the prebonding energy is less than the bonding energy.

4. The method of claim 3, wherein the ultrasonic energy is maintained at the prebonding energy during at least part of the prebonding period of time.

5. The method of claim 1, wherein the ultrasonic energy is changed from the prebonding energy to the bonding energy prior to the time that the applied force reaches the bonding force.

6. The method of claim 5, wherein the ultrasonic energy is maintained at the bonding energy during at least a portion of the bonding period of time.

7. The method of claim 1, wherein the prebonding force period of time coincides with the prebonding energy period of time.

8. The method of claim 1, wherein the prebonding force is less than the bonding force, and the prebonding energy is less than the bonding energy.

* * * * *